United States Patent
Ogawa

(10) Patent No.: US 8,653,870 B2
(45) Date of Patent: Feb. 18, 2014

(54) PWM SIGNAL OUTPUT CIRCUIT

(75) Inventor: Takashi Ogawa, Gifu-ken (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/617,771

(22) Filed: Sep. 14, 2012

(65) Prior Publication Data
US 2013/0069702 A1    Mar. 21, 2013

(30) Foreign Application Priority Data

Sep. 15, 2011 (JP) .................................. 2011-202183

(51) Int. Cl.
*H03K 5/04* (2006.01)
(52) U.S. Cl.
USPC ............................. 327/175; 327/172; 327/176
(58) Field of Classification Search
USPC .................................................. 327/175, 172
See application file for complete search history.

(56) References Cited

U.S. PATENT DOCUMENTS

| | | | |
|---|---|---|---|
| 7,372,902 B2 * | 5/2008 | Matsushima | 375/238 |
| 2007/0293125 A1 * | 12/2007 | Jenkins et al. | 446/454 |
| 2010/0026219 A1 * | 2/2010 | Nakai | 318/400.11 |

FOREIGN PATENT DOCUMENTS

| | | |
|---|---|---|
| JP | 2004-170797 A | 6/2004 |
| KR | 10-2009-0045142 | 5/2009 |
| WO | 2008/026319 A1 | 3/2008 |

OTHER PUBLICATIONS

Office Action mailed Oct. 7, 2013, for Korean Application No. 10-2012-101855 (with translation)(8 pages).

* cited by examiner

*Primary Examiner* — Long Nguyen
*Assistant Examiner* — Patrick Chen
(74) *Attorney, Agent, or Firm* — Osha • Liang LLP

(57) ABSTRACT

A PWM-signal-output circuit includes a first output unit to output a PWM signal with a first duty cycle, in a first period in which a motor starts rotating, a second output unit to output the PWM signal whose duty cycle increases toward a second duty cycle and decreases from the second duty cycle in a period from a logic level change in speed signal until its subsequent logic level change, in a second period following the first, the speed signal having a period corresponding to a motor-rotation speed and a logic level changing alternately, and a third output unit to output the PWM signal whose duty cycle increases toward that of the input signal and thereafter decreases from that of the input signal in a period from a logic level change in the speed signal until its subsequent logic level change, after the second period elapses.

4 Claims, 14 Drawing Sheets

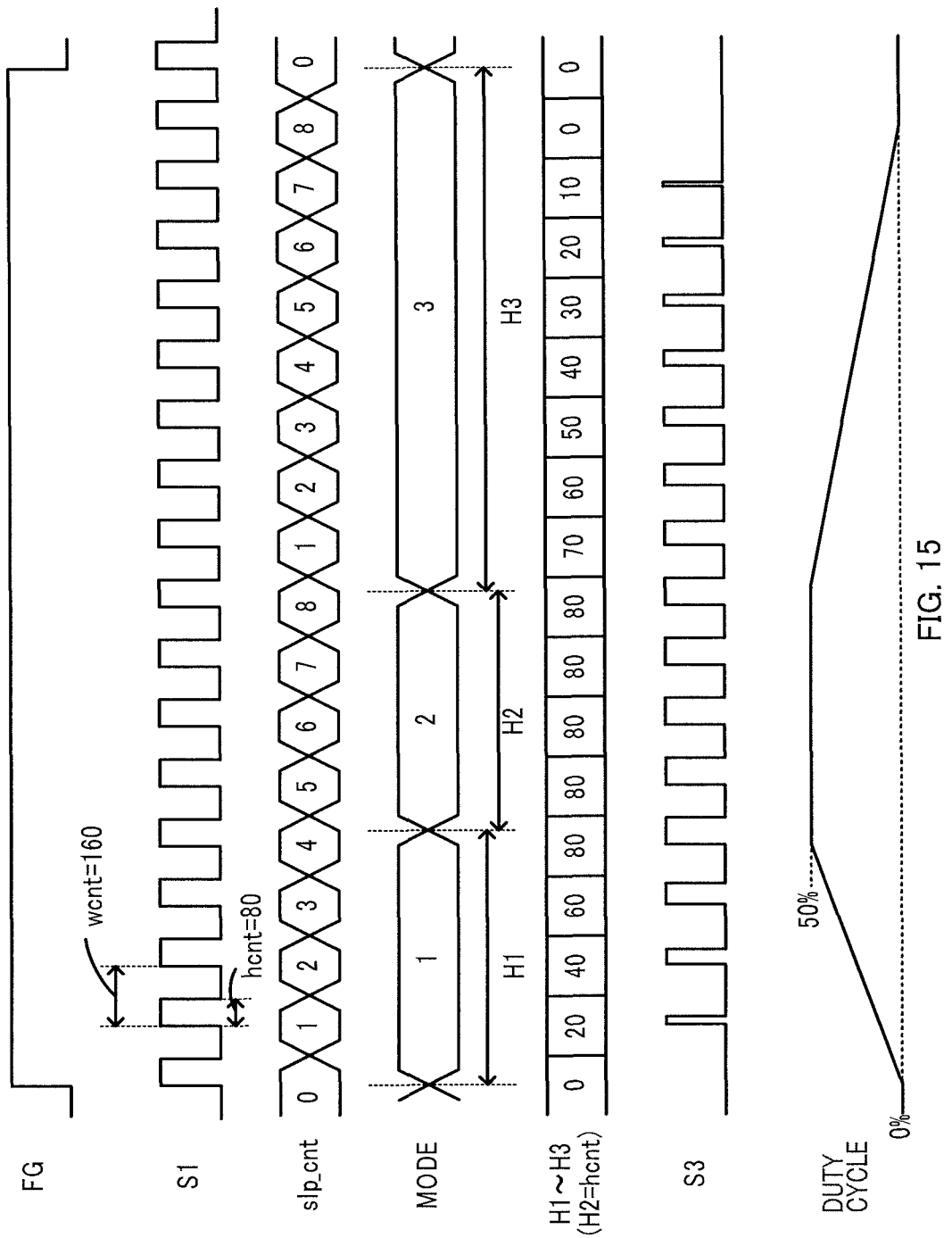

US 8,653,870 B2

PWM SIGNAL OUTPUT CIRCUIT

CROSS-REFERENCE TO RELATED APPLICATION

This application claims the benefit of priority to Japanese Patent Application No. 2011-202183, filed Sep. 15, 2011, of which full contents are incorporated herein by reference.

BACKGROUND OF THE INVENTION

1. Field of the Invention

The present invention relates to a PWM signal output circuit.

2. Description of the Related Art

Among motor drive circuits, there is a circuit configured to drive a motor based on a PWM (Pulse Width Modulation) signal (see, e.g., International Publication No. 2008/026319).

The motor drive circuit disclosed in International Publication No. 2008/026319 drives the motor based on the PWM signal with the duty cycle of 100%, for example, so that a voltage is applied to a motor coil of the motor for a long time, when starting a rotation of the motor. Then, when the rotation speed of the motor has increased to a certain extent, the motor drive circuit drives the motor based on the PWM signal with a duty cycle corresponding to a target rotation speed of the motor.

The motor drive circuit disclosed in International Publication No. 2008/026319 drives the motor based on the PWM signal with the duty cycle of 100%, for example, for a long time in order to rotate the motor reliably. Thus, at the time of starting the motor, a current flowing through the motor abruptly changes with the timing of phase switching, for example, and the noise when the motor rotates tends to become high. Further, the abrupt change in the current at the time of the phase switching deteriorates the torque efficiency as a result.

SUMMARY OF THE INVENTION

A PWM signal output circuit according to an aspect of the present invention, which is configured to output a PWM signal with a duty cycle corresponding to a duty cycle of an input signal to a drive circuit configured to drive a motor based on the PWM signal, includes: a first output unit configured to output the PWM signal with a first duty cycle, in a first time period in which the motor starts to rotate; a second output unit configured to output the PWM signal whose duty cycle increases toward a second duty cycle and thereafter decreases from the second duty cycle so as to cause a current flowing through a motor coil of the motor to increase and thereafter decrease in a time period from a change in logic level of a speed signal until a subsequent change in logic level of the speed signal, if the speed signal changes in logic level, in a second time period following the first time period, the speed signal having a period corresponding to a rotation speed of the motor as well as having a logic level changing in an alternate manner; and a third output unit configured to output the PWM signal whose duty cycle increases toward the duty cycle of the input signal and thereafter decreases from the duty cycle of the input signal so as to cause the current flowing through the motor coil to increase and thereafter decrease in a time period from a change in logic level of the speed signal until a subsequent change in logic level of the speed signal, if the speed signal changes in logic level, after elapse of the second time period.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which:

FIG. 3 is a diagram illustrating a configuration of a duty cycle changing circuit 46a;

FIG. 9 is a diagram for describing an operation of a duty cycle changing circuit 46a;

FIG. 15 is a diagram for describing an operation of a duty cycle changing circuit 46b.

DETAILED DESCRIPTION OF THE INVENTION

At least the following details will become apparent from descriptions of this specification and of the accompanying drawings.

Figure 1:
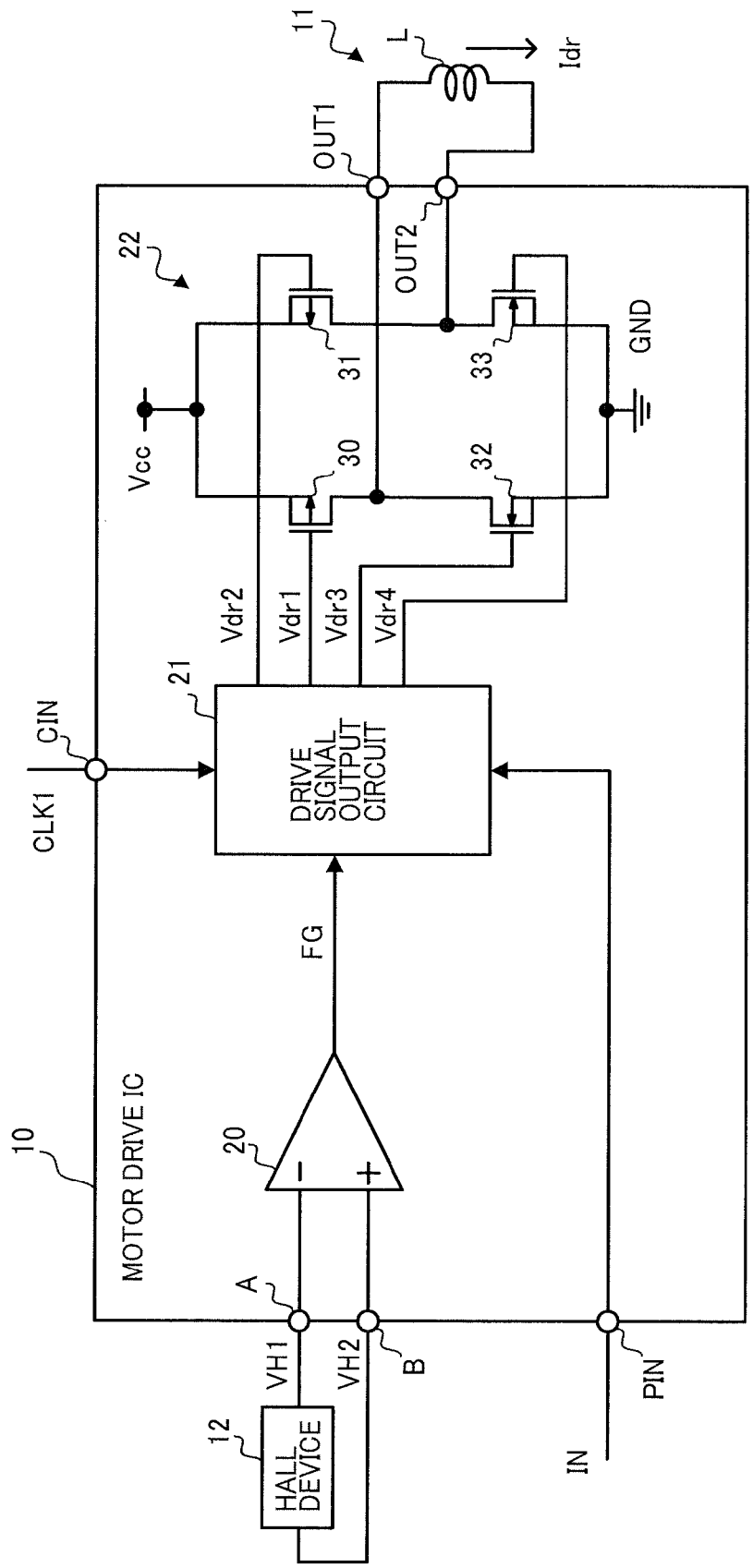
FIG. 1 is a diagram illustrating a configuration of a motor drive IC 10 according to an embodiment of the present invention.

FIG. 1 depicts a configuration of a motor drive IC 10 according to an embodiment of the present invention. The motor drive IC 10 is a circuit configured to drive a motor 11 so that the rotation speed of the motor 11 reaches the rotation speed according to the duty cycle of a PWM (Pulse Width Modulation) signal IN outputted from a microcomputer (not shown).

The motor drive IC 10 includes a comparator 20, a drive signal output circuit 21, an H-bridge circuit 22, and terminals A, B, PIN, CIN, OUT1, and OUT2.

The motor 11 is a single-phase fan motor configured to rotate a cooling fan, for example.

A Hall device 12 is configured to output, to the terminals A and B, Hall signals VH1 and VH2 acquired according to the rotational position of a rotor (not shown) in the motor 11, respectively.

The comparator 20 is configured to compare levels of the Hall signals VH1 and VH2 and generate an FG (Frequency Generator) signal with such a period as to change according to the rotation speed of the motor 11. The FG signal (speed signal) goes low (hereinafter, L level) when the level of the Hall signal VH1 becomes higher than the level of the Hall signal VH2, and goes high (hereinafter, H level) when the level of the Hall signal VH1 becomes lower than the level of the Hall signal VH2. Therefore, the logic level of the FG signal changes every half period.

The drive signal output circuit 21 (PWM signal output circuit) is configured to output drive signals Vdr1 to Vdr4 for controlling the H-bridge circuit 22, based on a clock signal CLK1 with the predetermined period, which is to be inputted via the terminal CIN, a PWM signal IN, which is to be inputted via the terminal PIN, and the FG signal.

The H-bridge circuit 22 (drive circuit) includes PMOS transistors 30 and 31 and NMOS transistors 32 and 33. A connection point between the PMOS transistor 30 and the NMOS transistor 32 is connected to the terminal OUT1, and the connection point between the PMOS transistor 31 and the NMOS transistor 33 is connected to the terminal OUT2. When the transistors of the H-bridge circuit 22 are turned on/off, a drive current Idr flowing through a motor coil L of the motor 11 flows from the terminal OUT1 to the terminal OUT2 or from the terminal OUT2 to the terminal OUT1.

==Regarding Drive Signal Output Circuit 21==

Figure 2:
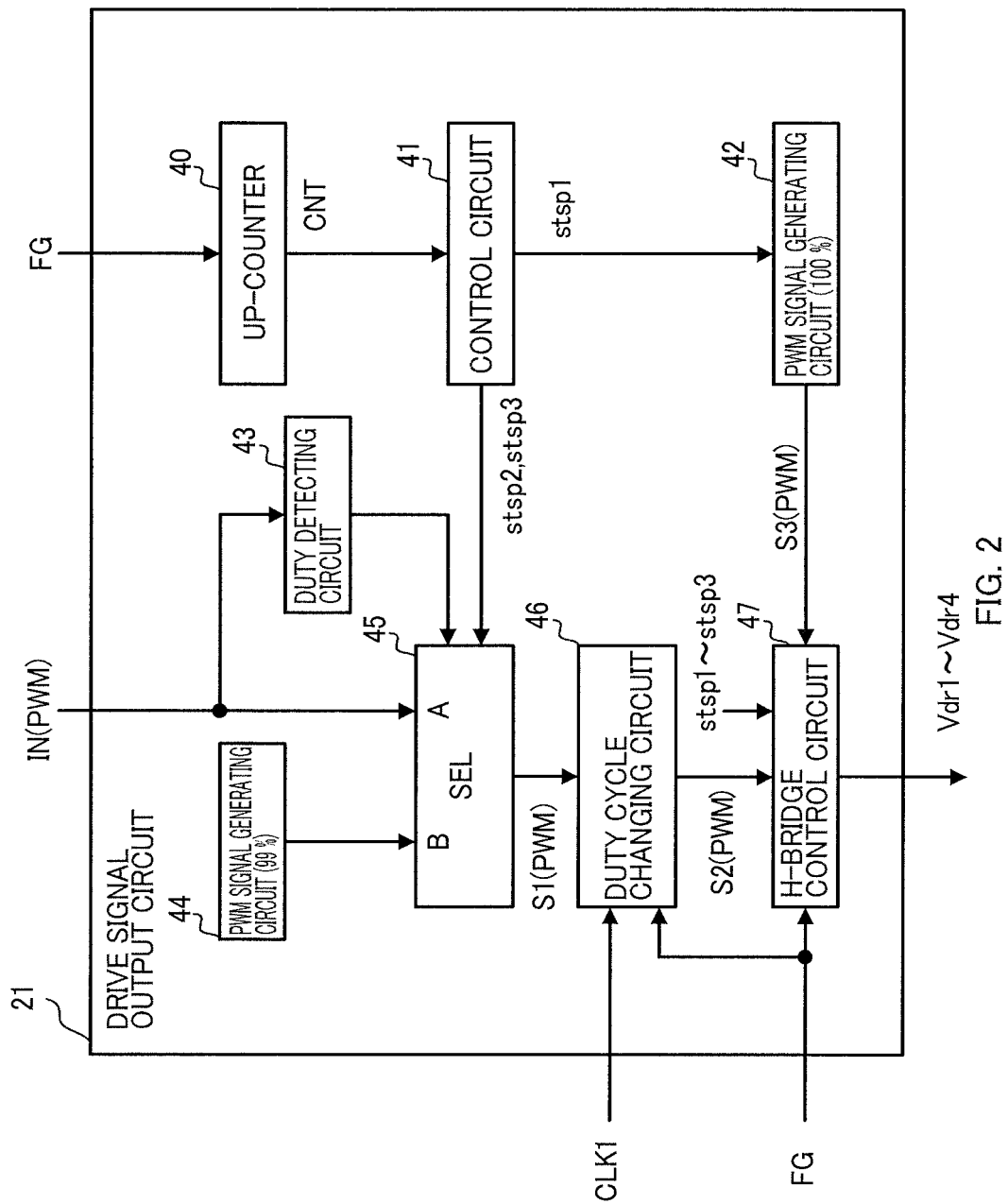
FIG. 2 is a diagram illustrating a configuration of a drive signal output circuit 21.

A drive signal output circuit 21 depicted in FIG. 2 includes an up-counter 40, a control circuit 41, PWM signal generating circuits 42 and 44, a duty detecting circuit 43, a selector 45, a duty cycle changing circuit 46, and an H-bridge control circuit 47.

The up-counter 40 is configured to increment a count value CNT by "1" on every rising edge of the FG signal. The count value CNT of the up-counter 40 is reset, when the motor drive IC 10 is started, for example. Thus, when the motor 11 starts to rotate from the stopped state to generate the FG signal, the count value CNT increases.

The control circuit 41 is configured to output a signal stsp1 in a time period Tx (first time period), in which the motor 11 starts to rotate, and output a signal stsp2 in a time period Ty (second time period) following the time period Tx. Further, the control circuit 41 is configured to output a signal stsp3 when the time period Ty is ended.

Specifically, the control circuit 41 outputs the signal stsp1 in the time period Tx from when the motor 11 starts to rotate until when the count value CNT reaches "5" (first count value), for example. Then, the control circuit 41 outputs the signal stsp2 in the time period Ty from when the count value CNT reaches "5" until when the count value CNT reaches "17" (second count value), for example, and outputs the signal stsp3 when the count value CNT reaches "17".

The PWM signal generating circuit 42 (first output unit) is configured to generate the PWM signal S3 with a high-level duty cycle (hereinafter referred to simply as duty cycle) of 100% (first duty cycle) in the time period Tx during which the signal stsp1 is outputted.

The duty detecting circuit 43 is configured to detect whether or not the duty cycle of the PWM signal IN inputted thereto is 100%. Specifically, the duty detecting circuit 43 detects that the duty cycle of the PWM signal IN is 100% if the rising edge of the PWM signal IN is not detected for a predetermined period.

The PWM signal generating circuit 44 generates the PWM signal with the predetermined period with a duty cycle of 99%, for example.

The selector 45 is configured to output the PWM signal with a duty cycle of 99% (second duty cycle) that is to be inputted to B input thereof, if the signal stsp2 is inputted thereto or if it is detected that the PWM signal IN has a duty cycle of 100%. The selector 45 is configured to output the PWM signal IN that is to be inputted to A input thereof, if it is detected that the duty cycle of the PWM signal IN is not 100%, while the signal stsp3 is inputted. Thus, a PWM signal S1 with a duty cycle equal to or smaller than 99% is constantly outputted from the selector 45.

The duty cycle changing circuit 46 is configured to change the duty cycle of the PWM signal S1 and output the PWM signal S1 with the changed duty cycle. Specifically, when the FG signal changes in logic level, the duty cycle changing circuit 46 outputs a PWM signal S2 whose duty cycle increases in a stepwise manner from 0% toward the duty cycle of the PWM signal S1 and thereafter decreases in a stepwise manner.

The up-counter 40, the control circuit 41, the PWM signal generating circuit 44, the selector 45, and the duty cycle changing circuit 46 correspond to a second output unit, and the up-counter 40, the control circuit 41, the selector 45, and the duty cycle changing circuit 46 correspond to a third output unit. The up-counter 40 corresponds to a counter.

<<Details of Duty Cycle Changing Circuit 46>>

Figure 3:
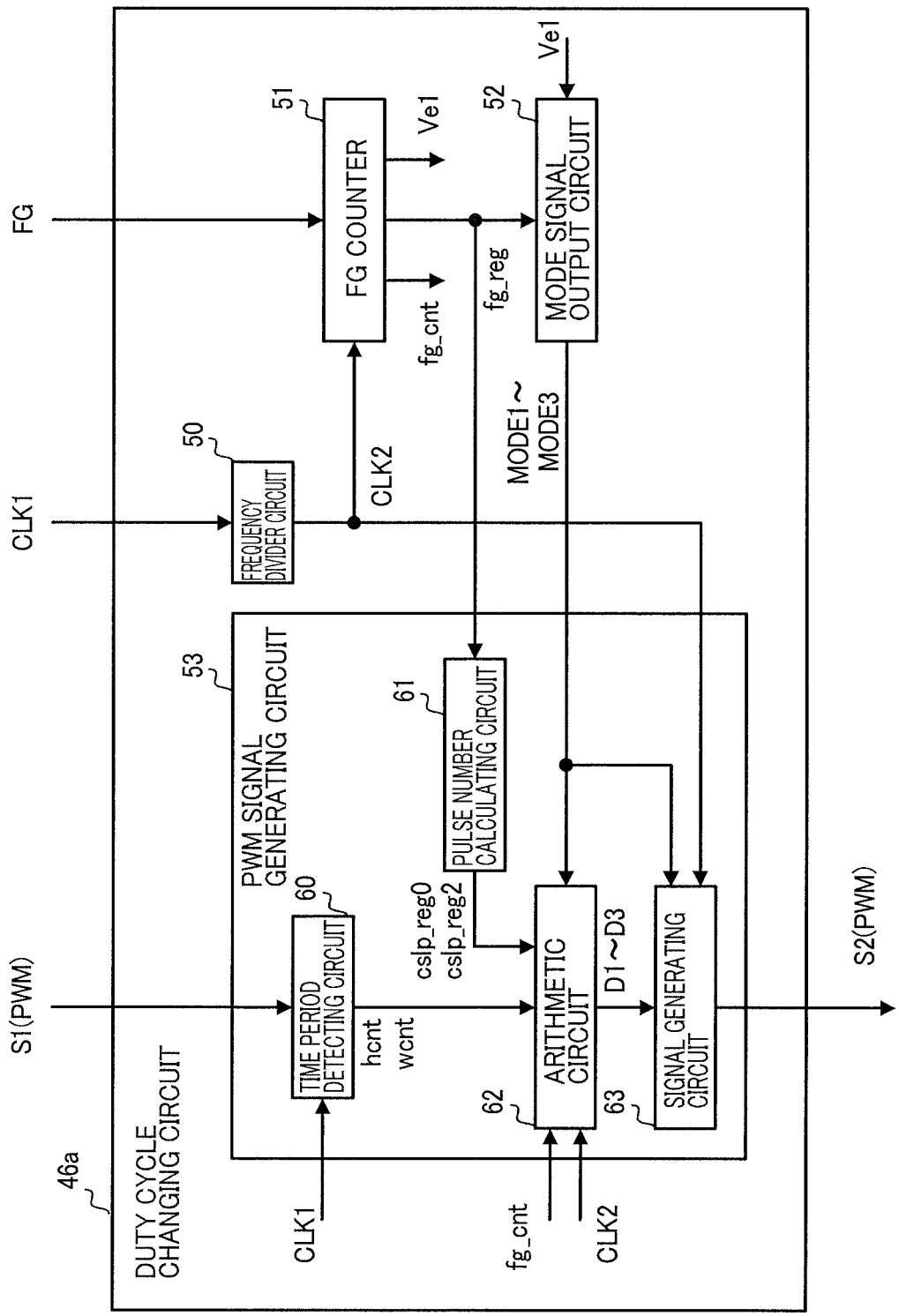

FIG. 3 depicts a configuration of the duty cycle changing circuit 46 according to a first embodiment of the present invention.

A duty cycle changing circuit 46a includes a frequency divider circuit 50, an FG counter 51, a mode signal output circuit 52, and a PWM signal generating circuit 53.

The frequency divider circuit 50 is configured to generate a clock signal CLK2 obtained by frequency-dividing the clock signal CLK1 by 128, for example.

The FG counter 51 is configured to detect each of a time period TA during which the FG signal is high and a time period TA during which the FG signal is low, that is, a time period that is substantially equal to half the period of the FG signal.

The mode signal output circuit 52 is configured to divide the time period TA detected by the FG counter 51 into three time periods T1 to T3, and output mode signals MODE1 to MODE3 indicative of these periods T1 to T3, respectively. A time period T1 is a time period in which the drive current Idr is increased in a stepwise manner, a time period T2 is a time period in which the drive current Idr is maintained constant, and the time period T3 is a time period in which the drive current Idr is decreased in a stepwise manner.

The PWM signal generating circuit 53 is configured to generate such a PWM signal S2 whose duty cycle increases in a stepwise manner in a time period T1; is equal to the duty cycle of the PWM signal S1 in the time period T2; and decreases in a stepwise manner in the time period T3. That is, the PWM signal generating circuit 53 is configured to output such a PWM signal S2 that the drive current Idr increases and thereafter decreases in the time period TA. The PWM signal generating circuit 53 generates the PWM signal S2 with a duty cycle of 0%, for example, after elapse of the time period TA.

<<Details of FG Counter 51>>

Figure 4:
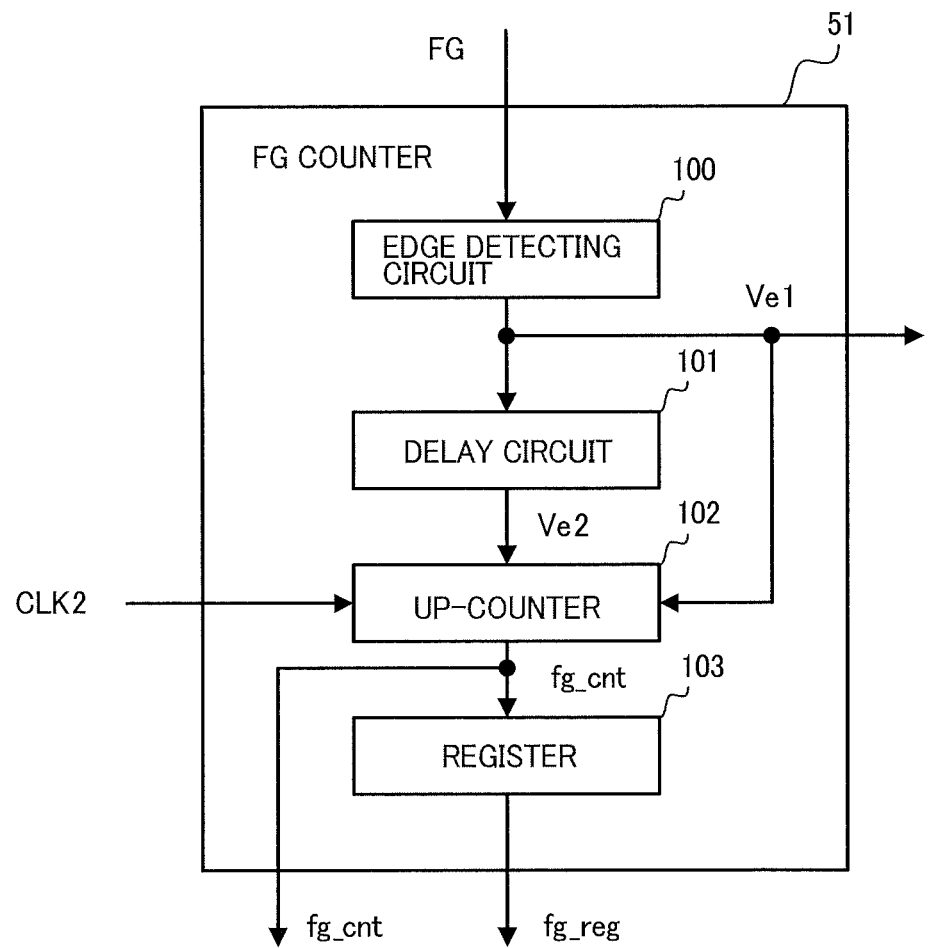
FIG. 4 is a diagram illustrating a configuration of an FG counter 51.

The FG counter 51 includes an edge detecting circuit 100, a delay circuit 101, an up-counter 102, and a register 103, as depicted in FIG. 4, for example.

The edge detecting circuit 100 is configured to detect the rising edge and the falling edge of the FG signal, and output an edge pulse Ve1.

The delay circuit 101 is configured to delay the edge pulse Ve1 by a predetermined time, and output a result as an edge pulse Ve2. A design is made such that the delay time in the delay circuit 101 is sufficiently shorter than the period of the clock signal CLK2.

The up-counter 102 is configured to count up based on the clock signal CLK2, and store a count value in the register 103 when the edge pulse Ve1 is inputted thereto. Further, the count value of the up-counter 102 is reset when the edge pulse Ve2 is inputted thereto.

Figure 5:
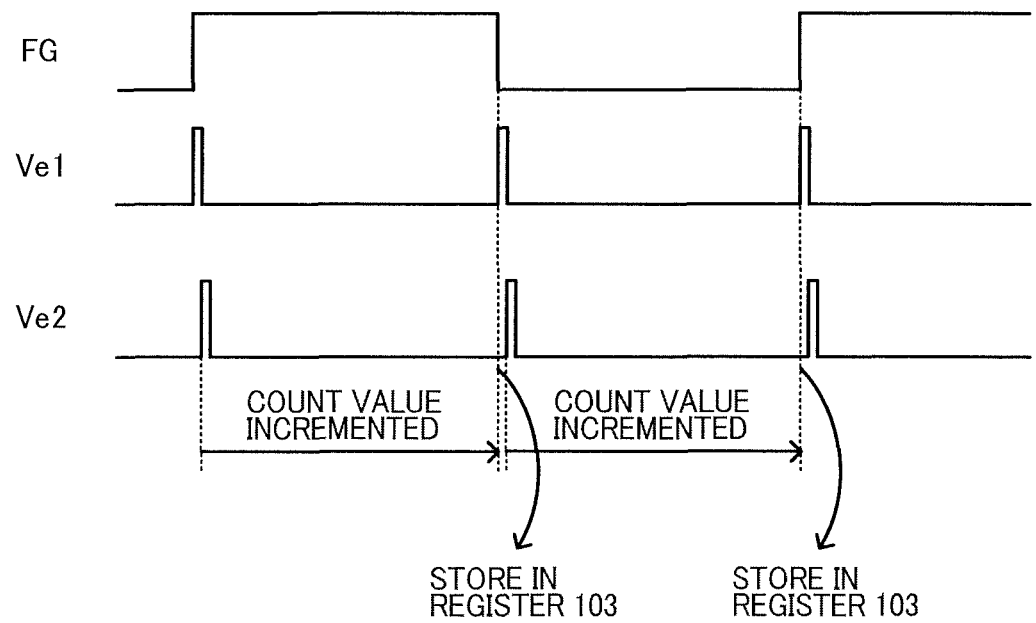
FIG. 5 is a diagram for describing an operation of an FG counter 51.

Thus, for example, as depicted in FIG. 5, every time the edge pulse Ve1 is outputted, the count value indicative of the time period during which the FG signal is high or the count value indicative of the time period during which the FG signal is low is stored in the register 103. Here, the count value of the up-counter 102 is given as count value fg_cnt, and the count value to be stored in the register 103 is given as count value fg_reg. The count value fg_reg is updated every time the up-counter 102 stores the count value.

<<Details of Mode Signal Output Circuit 52>>

Figure 6:
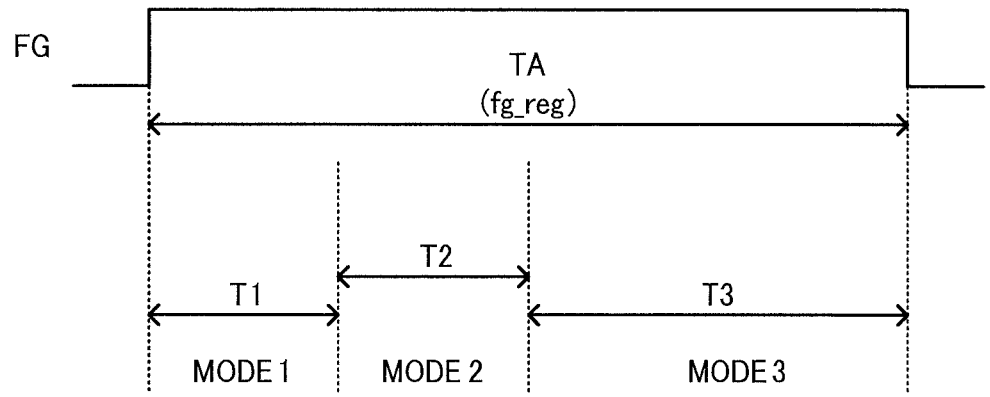
FIG. 6 is a diagram illustrating a relationship of a time period TA and time periods T1 to T3.

The mode signal output circuit 52 is configured to divide the time period TA into the three time periods T1 to T3 and output the mode signals MODE1 to MODE3 indicative of the respective time periods T1 to T3, as depicted in FIG. 6, for example.

Figure 7:
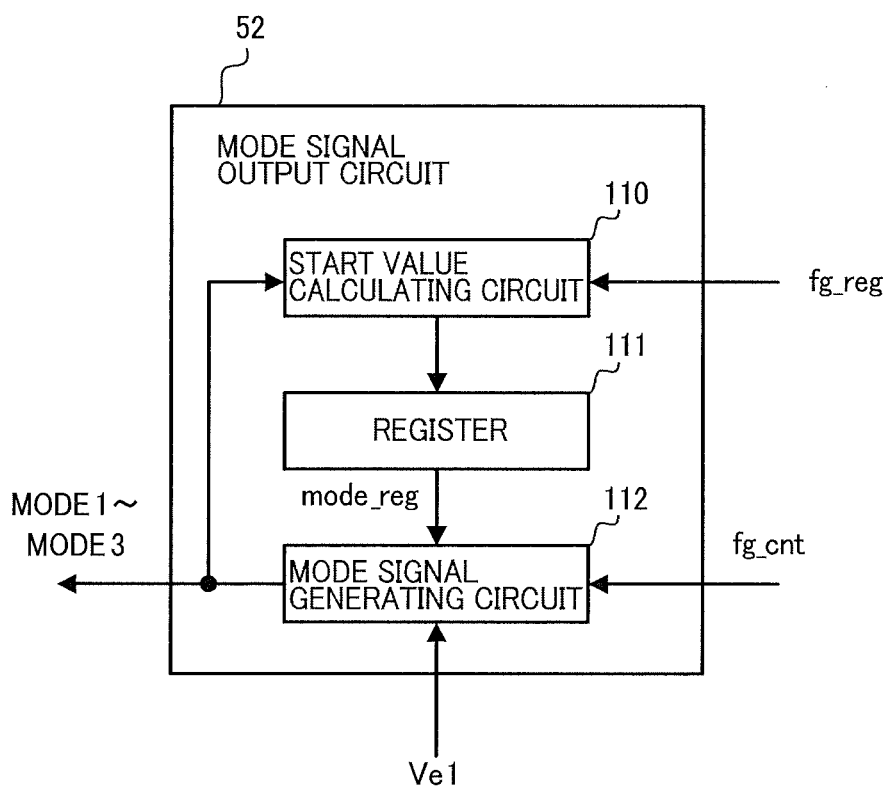
FIG. 7 is a diagram illustrating a configuration of a mode signal output circuit 52.

The mode signal output circuit 52 includes a start value calculating circuit 110, a register 111, and a mode signal generating circuit 112, as depicted in FIG. 7.

The start value calculating circuit 110 is configured to calculate a count value at which each of the time period T2 and the time period T3 is started, from the count value fg_reg indicative of the time period TA. Specifically, when the time period TA is divided such that the ratio of the time period T1, the time period T2, and the time period T3 becomes 1:1:2, for example, a count value CNT1 indicative of the start of the time period T2 results in (¼)×fg_reg, and a count value CNT2 indicative of the start of the time period T3 results in (½)× fg_reg. Therefore, the start value calculating circuit 110 calculates the count value CNT2 by shifting the count value fg_reg to the right by one bit, and calculates the count value CNT1 by shifting the count value fg_reg to the right by two bits, for example.

Further, the start value calculating circuit 110 stores the count value CNT1 indicative of the start of the time period T2 in the register 111 when the mode signal MODE1 is outputted, that is, during the time period T1. Furthermore, the start value calculating circuit 110 stores the count value CNT2 in the register 111 when the mode signal MODE2 is outputted, and stores the count value fg_reg in the register 111 when the mode signal MODE3 is outputted. A count value mode_reg of the register 111 is updated every time the count value is stored.

The mode signal generating circuit 112 is configured to compare the count value fg_cnt of the FG signal and the count value mode_reg, and output the mode signal in accordance with a result of such comparison. Further, the mode signal generating circuit 112 is configured to generate the mode signal MODE1 when the edge signal Ve1 is inputted thereto, namely, when the count value fg_cnt reaches zero. Then, when the count value fg_cnt is incremented to reach the count value CNT1, the mode signal generating circuit 112 generates the mode signal MODE2. Furthermore, when the count value fg_cnt is incremented to reach the count value CNT2, the mode signal generating circuit 112 generates the mode signal MODE3.

Figure 8:
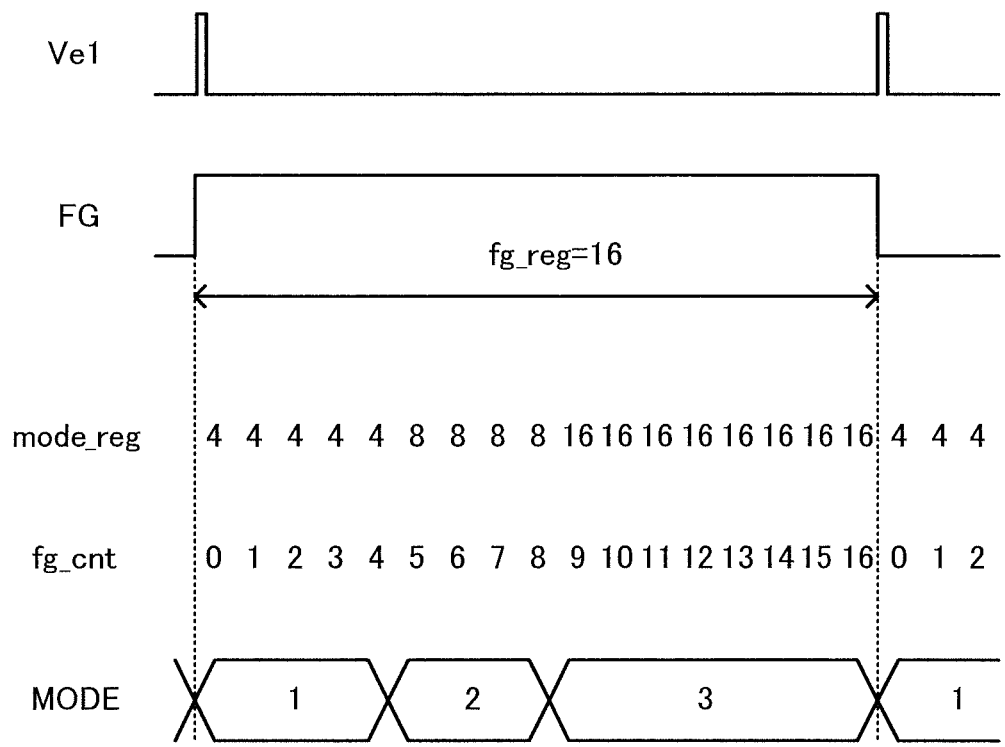
FIG. 8 is a diagram for describing an operation of a mode signal output circuit 52.

FIG. 8 is a diagram for describing an operation of the mode signal output circuit 52. A description will be given assuming that the count value fg_reg is "16", for example. Thus, the count value CNT1 at which the time period T2 starts results in "4" ((¼)×fg_reg), and the count value CNT2 at which the time period T3 starts results in "8" ((½)×fg_reg).

Firstly, when the edge pulse Ve1 is outputted, the mode signal MODE1 is generated and the count value mode_reg is set at "4". Therefore, the mode signal MODE1 indicative of the time period T1 is outputted until the count value fg_cnt reaches "4".

Next, when the count value fg_cnt reaches "4, the mode signal changes to MODE2" as well as the count value mode_reg is changed to "8". Therefore, the mode signal MODE2 indicative of the time period T2 is generated until the count value fg_cnt reaches "8".

Then, when the count value fg_cnt reaches "8", the mode signal MODE3 indicative of the time period T3 is generated. As such, the mode signal output circuit 52 is configured to divide the time period TA into the three time periods T1 to T3, and output the mode signals MODE1 to MODE3 corresponding to the respective periods T1 to T3.

<<Details of PWM Signal Generating Circuit 53>>

The PWM signal generating circuit 53 includes a time period detecting circuit 60, a pulse number calculating circuit 61, an arithmetic circuit 62, and a signal generating circuit 63.

The time period detecting circuit 60 is configured to detect the period of the inputted PWM signal S1 and a time period of high level in one period of the PWM signal S1. The time period detecting circuit 60 detects the period, etc., of the PWM signal S1, using a counter (not shown) that is configured to change the count value in synchronization with the clock signal CLK1 similarly to the FG counter 51, for example. Further, the time period detecting circuit 60 is configured to output the detected period of the PWM signal S1 as a count value wcnt, and output the detected high-level period in the one period of the PWM signal S1 as a count value hcnt.

The pulse number calculating circuit 61 is configured to calculate the number of pulses of the PWM signal S2 that the PWM signal generating circuit 53 can output during each of the time periods T1 and T3. The PWM signal S2 according to an embodiment of the present invention is generated in synchronization with the clock signal CLK2 used in counting the time period TA. Thus, the pulse number calculating circuit 61 calculates the number of pulses cslp_reg0 of the PWM signal S2 that can be outputted in the time period T1 by multiplying the count value fg_reg indicative of the number of pulses in the time period TA as a whole by the ratio of the time period T1. Further, the pulse number calculating circuit 61 calculates the number of pulses cslp_reg2 of the PWM signal S2 that can be outputted in the time period T3, by multiplying the count value fg_reg by the ratio of the time period T3. This number of pulses cslp_reg0 is equal to the amount of change in the count value fg_cnt in the time period T1 in the FG counter 51, and the number of pulses cslp_reg2 is equal to the amount of change in the count value fg_cnt in the time period T3.

The arithmetic circuit 62 is configured to calculate, in synchronization with the clock signal CLK2, duty cycles D1 to D3 of the PWM signal S2 in the respective time periods T1 to T3.

Specifically, the arithmetic circuit 62 is configured to calculate the duty cycle D1 in the time period T1, based on the following equation (1), every time the count value fg_cnt changes.

$$D1 = (duty/cslp\_reg0) \times fg\_cont \quad (1)$$

where duty=hcnt/wcnt. As is apparent from the equation (1), as the time period T1 starts and the count value fg_cnt is incremented, the duty cycle D1 increases. In the equation (1), "cslp_reg0" is the amount of change in the count value fg_cnt until the end of the time period T1. Therefore, when the time period T1 ends, the duty cycle D1 results in D1=duty.

The arithmetic circuit 62 calculates the duty cycle D2 in the time period T2, based on an equation (2).

$$D2 = duty \quad (2)$$

Further, the arithmetic circuit 62 calculates duty cycle D3 in the time period T3, based on an equation (3), every time the count value fg_cnt changes.

$$D3 = duty - (duty/cslp\_reg2) \times (fg\_cnt - CNT2) \quad (3)$$

where the count value CNT2 is the count value fg_cnt at which the time period T3 starts, and is (½)×fg_reg, for example. Thus, as the count value fg_cnt is incremented, the duty cycle D3 decreases. Further, in the equation (3), "cslp_reg2" is the amount of change in the count value fg_cnt until the end of the time period T3. Therefore, when the count value fg_cnt becomes equal to fg_reg, the duty cycle D3 results in D3=0.

Incidentally, the time period T3 is a time period calculated based on the FG signal inputted to the FG counter 51 in the past, and the count value fg_cnt is the count value of the FG signal being inputted to the FG counter 51 at present. Thus, for example, even after the time period T3 ends, the mode signal MODES may continue to be outputted and the count value fg_cnt may continue to be incremented. In such a case, since the count value fg_cnt continues to be incremented, the duty cycle D3 results in a negative value. Therefore, when a result of the calculation of the duty cycle D3 results in a negative value, the arithmetic circuit 62 outputs "0" as the duty cycle D3, for example.

That is, when the equation (3) results in a negative value, D3 is given as follows:

$$D3 = 0 \quad (4)$$

When executing the calculation of the equations (1) and (3), the arithmetic circuit 62 calculates the product of a value indicative of the duty cycle (hcnt/wcnt) and the count value fg_cnt before division processing, in order to improve calculation accuracy.

The signal generating circuit 63 is configured to generate, in synchronization with the clock signal CLK2, the PWM signal S2 with the duty cycles D1 to D3 obtained by the arithmetic circuit 62.

Here, a description will be given of one example of the waveform of the PWM signal S2 generated in the signal generating circuit 63 with reference to FIG. 9.

Figure 9:
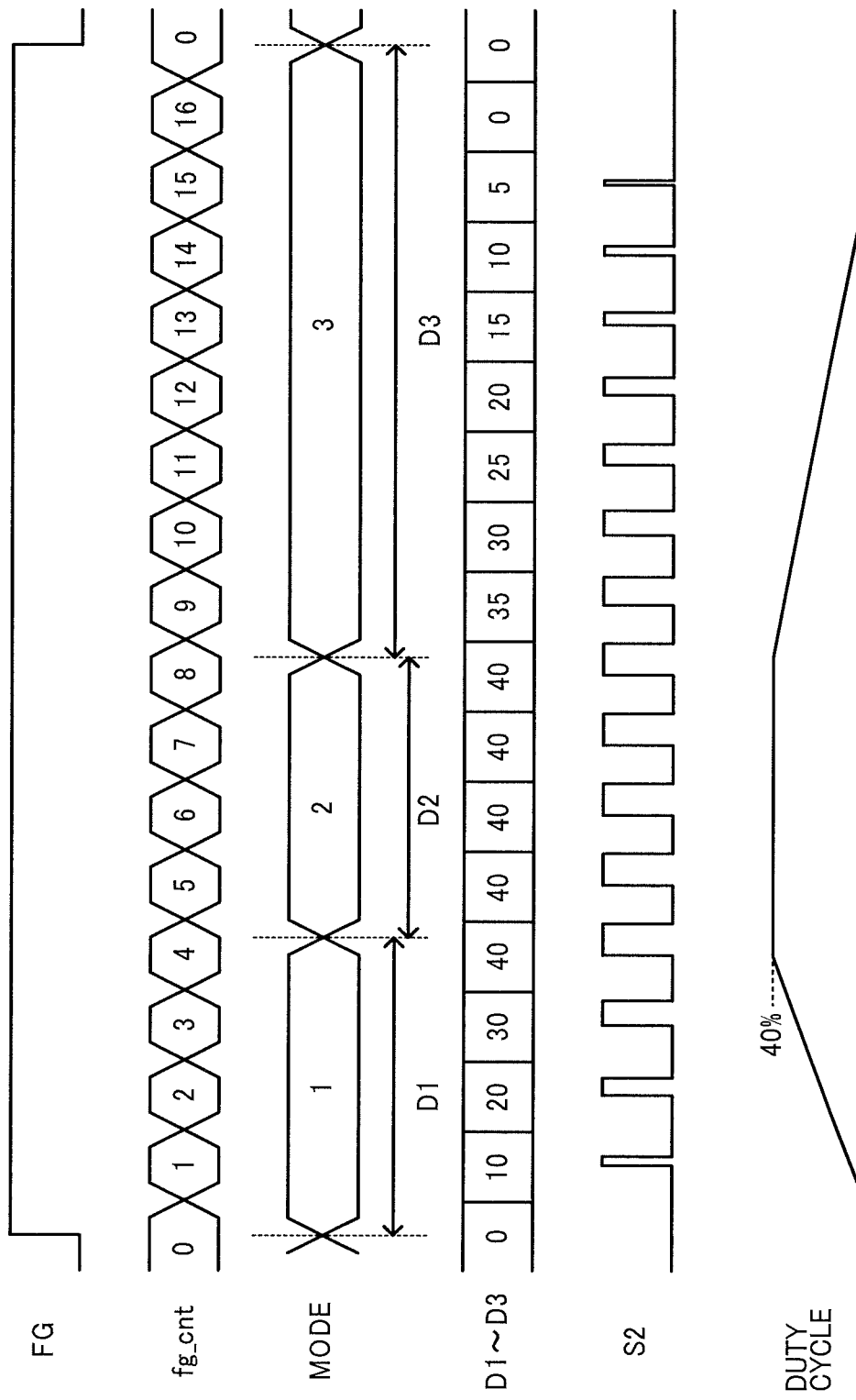

FIG. 9 depicts one example of the case where the time period, during which the FG signal being inputted to the FG counter 51 at present is high, is equal to the time period TA detected in the past. Here, similarly to the case of FIG. 8, the count value fg_reg indicative of the time period TA is given as "16", for example, the count value CNT1 at which the time period T2 starts is given as "4" ((¼)×fg_reg), and the count value CNT2 at which the time period T3 starts is given as "8" ((½)×fg_reg). Thus, "cslp_reg0" results in "4" and "cslp_reg2" results in "8". Further, it is assumed that the duty is duty=hcnt/wcnt=40%.

By assigning values to variables in the equation (1), the duty cycle D1 in the time period T1 is expressed by an equation (5).

$$D1 = (40/4) \times fg\_cont \quad (5)$$

Thus, until the count value fg_cnt changes from "0" to "4", the duty cycle D1 increases in a stepwise manner. When the count value fg_cnt is incremented to reach "4", the time period T2 is started. Duty cycle D2 in the time period T2 is maintained constant (40%) as is apparent from the equation (2).

When the count value fg_cnt is incremented to reach "8", the time period T3 is started. By assigning values to variables in the equation (3), the duty cycle D3 in the time period T3 is expressed by an equation (6).

$$D3 = 40 - (40/8) \times (fg\_cnt - 8) \quad (6)$$

Thus, until the count value fg_cnt changes from "9" to "16", the duty cycle D3 decreases in a stepwise manner. Thus, the duty cycle of the PWM signal S2 increases in a gradual manner, is maintained constant, and thereafter decreases in a gradual manner.

In FIG. 9, a description has been give of the case where the time period, during which the FG signal being inputted to the FG counter 51 at present is high, is equal to the time period TA detected in the past, the same applies to other cases. For example, when the time period during which the present FG signal is high or low is shorter than the time period TA detected in the past, the duty cycle becomes D1 with the timing of changing of the logic level of the FG signal. Whereas, when the time period during which the present FG signal is high or low is longer than the time period TA detected in the past, once the duty cycle decreases to reach 0%, 0% is maintained until the subsequent change in the logic level of the FG signal.

<<Details of H-Bridge Control Circuit 47>>

The H-bridge control circuit 47 depicted in FIG. 2 is configured to generate the drive signals Vdr1 to Vdr4, based on signals stsp1 to stsp3, the FG signal, and the PWM signals S2 and S3, and control the H-bridge circuit 22.

When the FG signal is high, the H-bridge control circuit 47 controls the H-bridge circuit 22 so that the drive current Idr flows from the terminal OUT1 to the terminal OUT2. Specifically, while the signal stsp1 is inputted, the H-bridge control circuit 47 causes the NMOS transistor 33 to be on and causes the PMOS transistor 31 and NMOS transistor 32 to be off, as well as performs switching of the PMOS transistor 30 based on the PWM signal S3. That is, while the FG signal is high and the signal stsp1 is inputted thereto, the PMOS transistor 30 and the NMOS transistor 33 are in a full-on state where they continue to be on. While the signal stsp2,3 is inputted thereto, the H-bridge control circuit 47 causes the NMOS transistor 33 to be on and causes the PMOS transistor 31 and NMOS transistor 32 to be off, as well as performs switching of the PMOS transistor 30 based on the PWM signal S2.

Whereas, when the FG signal is low, the H-bridge control circuit 47 controls the H-bridge circuit 22 so that the drive current Idr flows from the terminal OUT2 to the terminal OUT1. Specifically, while the signal stsp1 is inputted, the H-bridge control circuit 47 causes the NMOS transistor 32 to be on and causes the PMOS transistor 30 and NMOS transistor 33 to be off, as well as performs switching of the PMOS transistor 31 based on the PWM signal S3. That is, while the FG signal is low and the signal stsp1 is inputted thereto, the PMOS transistor 31 and the NMOS transistor 32 are in a full-on state where they continue to be on. While the signal stsp2, 3 is inputted thereto, the H-bridge control circuit 47 causes the NMOS transistor 32 to be on and causes the PMOS transistor 30 and NMOS transistor 33 to be off, as well as performs switching of the PMOS transistor 31 based on the PWM signal S2.

<<Example of Operation of Motor Drive IC 10>>

Figure 10:
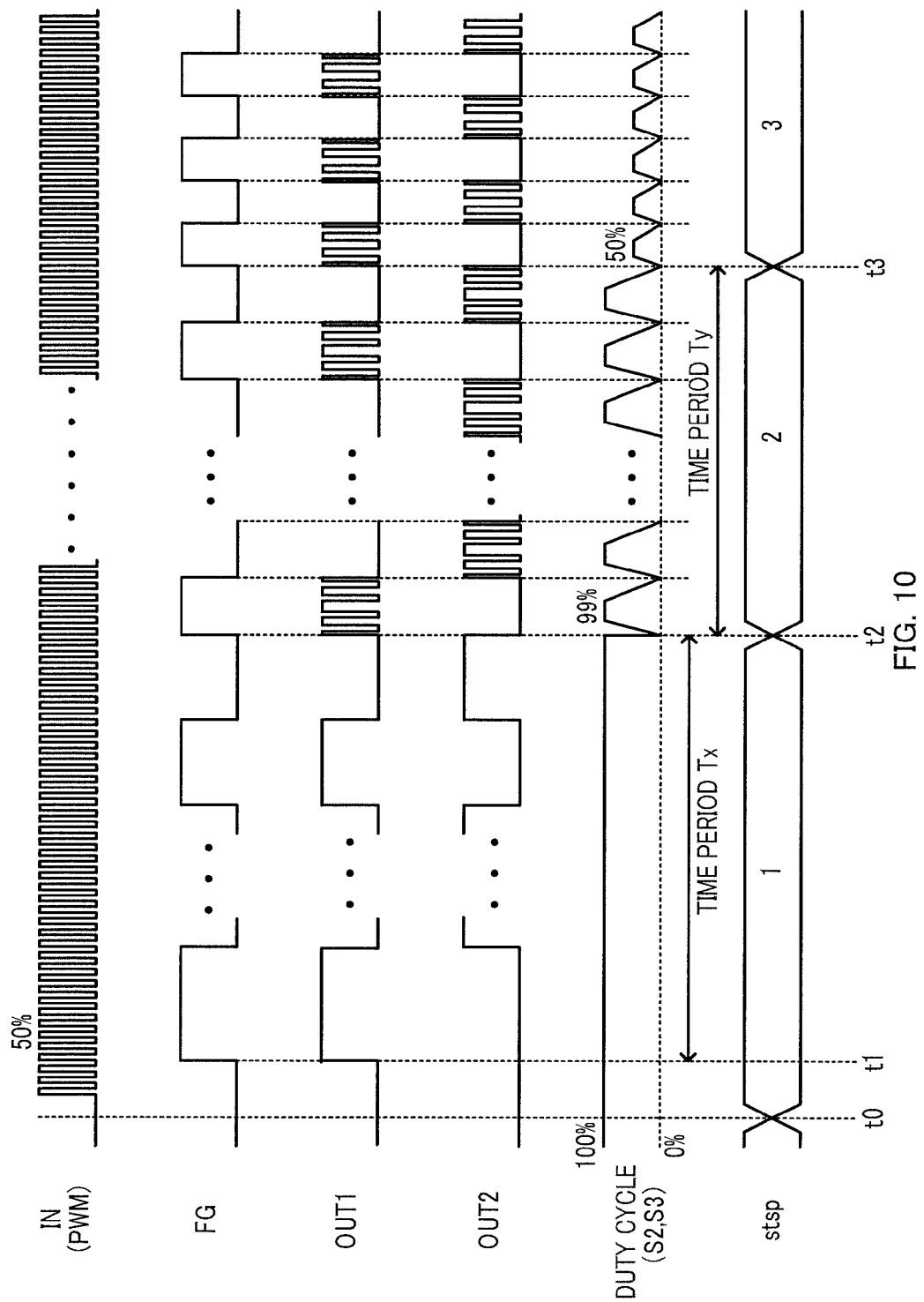
FIG. 10 is a diagram for describing an operation of a motor drive IC 10 when started.

FIG. 10 depicts major waveforms in the motor drive IC 10 at the start of the motor drive IC 10. It is assumed that when the motor drive IC 10 is started at time to, a starting circuit (not shown) starts to rotate the motor 11. It is also assumed that the PWM signal IN has a duty cycle of 50%.

Figure 11:
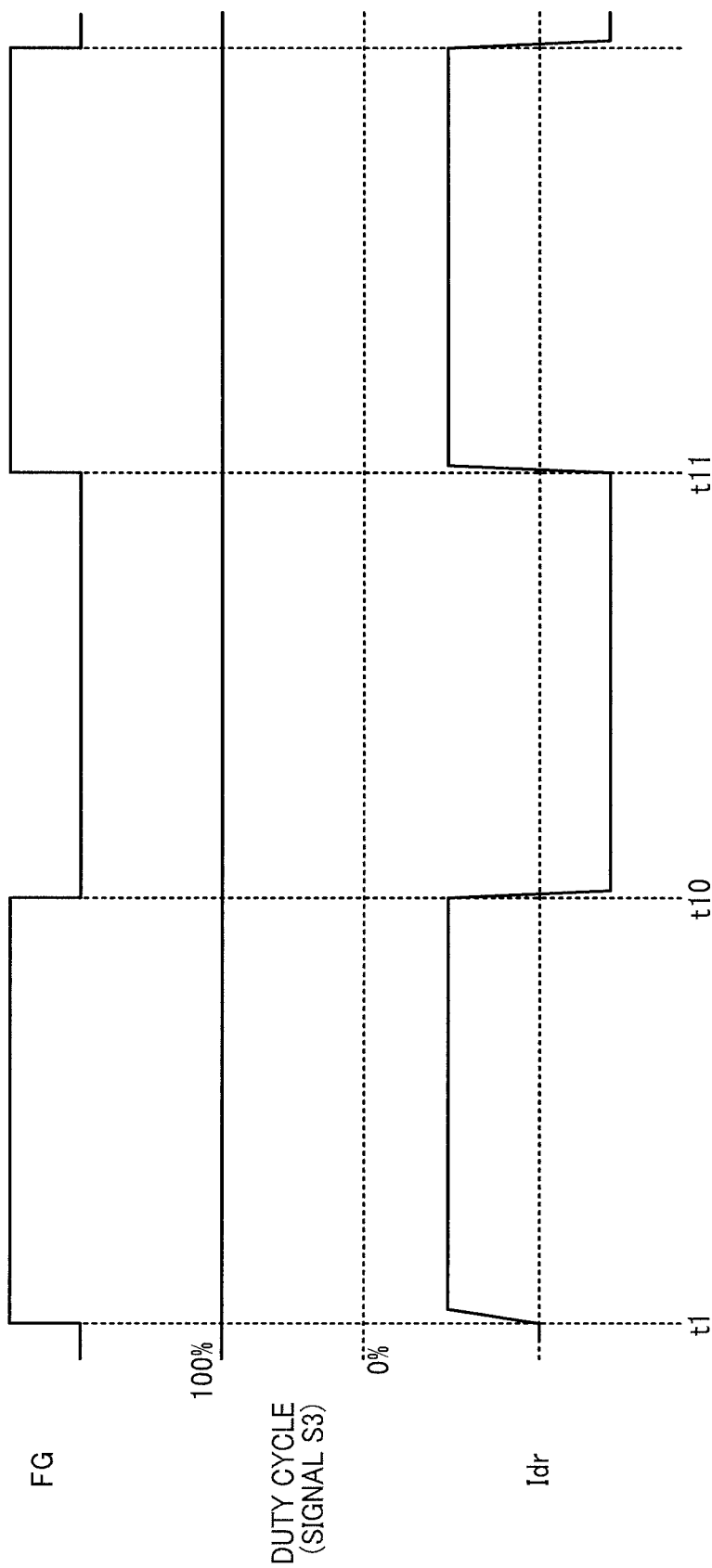
FIG. 11 is a diagram illustrating major waveforms of a motor drive IC 10 in a time period Tx.

When the motor 11 starts to rotate after the start of the motor drive IC 10 at time t0, since the signal stsp1 is generated, the PWM signal S3 with the duty cycle of 100% is generated. When the rotation of the motor 11 is started and the FG signal goes high at time t1, the H-bridge circuit 22 is driven by the PWM signal S3 with the duty cycle of 100%. Thus, the drive current Idr abruptly increases as depicted in FIG. 11. It is assumed here that the current flowing from the terminal OUT1 to the terminal OUT2 is a positive current. Thereafter, at time t10, when the FG signal changes in logic level to low, the drive current Idr abruptly decreases and flows in the negative direction. At time t11 and thereafter, the operation from time t1 to t10 is repeated. As such, while the signal stsp1 is generated, that is, in the time period Tx in which the motor 11 starts to rotate, the large drive current Idr changes in direction in response to the FG signal.

When the signal stsp2 is generated at time t2, the H-bridge circuit 22 is driven based on the PWM signal S2 whose duty cycle increases from 0% to 99% and thereafter decreases. As a result, as depicted in time t2 to t20 of FIG. 12, as the duty cycle of the PWM signal S2 increases in a stepwise manner, the drive current Idr increases in a gradual manner, and when the duty cycle of the PWM signal S2 is maintained constant, the change in the drive current Idr is suppressed. Then, as the duty cycle of the PWM signal S2 decreases in a stepwise manner, the drive current Idr decreases in a gradual manner. Thus, the drive current Idr flows that changes in a gentle manner in accordance with the duty cycle of the PWM signal S2.

Further, in time t20 to t21, since the FG signal is low, the drive current Idr similar to a current flowing in time t2 to t20 flows in the negative direction.

As such, while the signal stsp2 is generated (time period Ty), the drive current Idr is suppressed in value with the timing of the phase switching, and thereafter the drive current Idr is increased in value. Thus, an embodiment of the present invention can rotate the motor 11 in a silent manner while suppressing an abrupt change in the drive current Idr flowing through the motor 11.

When the signal stsp3 is generated at time t3, the duty cycle of the PWM signal S2 increases from 0% up to 50% that is the duty cycle of the inputted PWM signal IN, and thereafter decreases. As a result, the motor 11 rotates at the rotation speed obtained according to the duty cycle of the inputted PWM signal IN. The waveform of the drive current Idr at time t3 and thereafter changes similarly to the waveform depicted in FIG. 12. Since the duty cycle of the PWM signal S2 increases from 0% only up to 50% at time t3 and thereafter, the current value of the drive current Idr becomes smaller than the current value in time t2 to t3.

Figure 13:
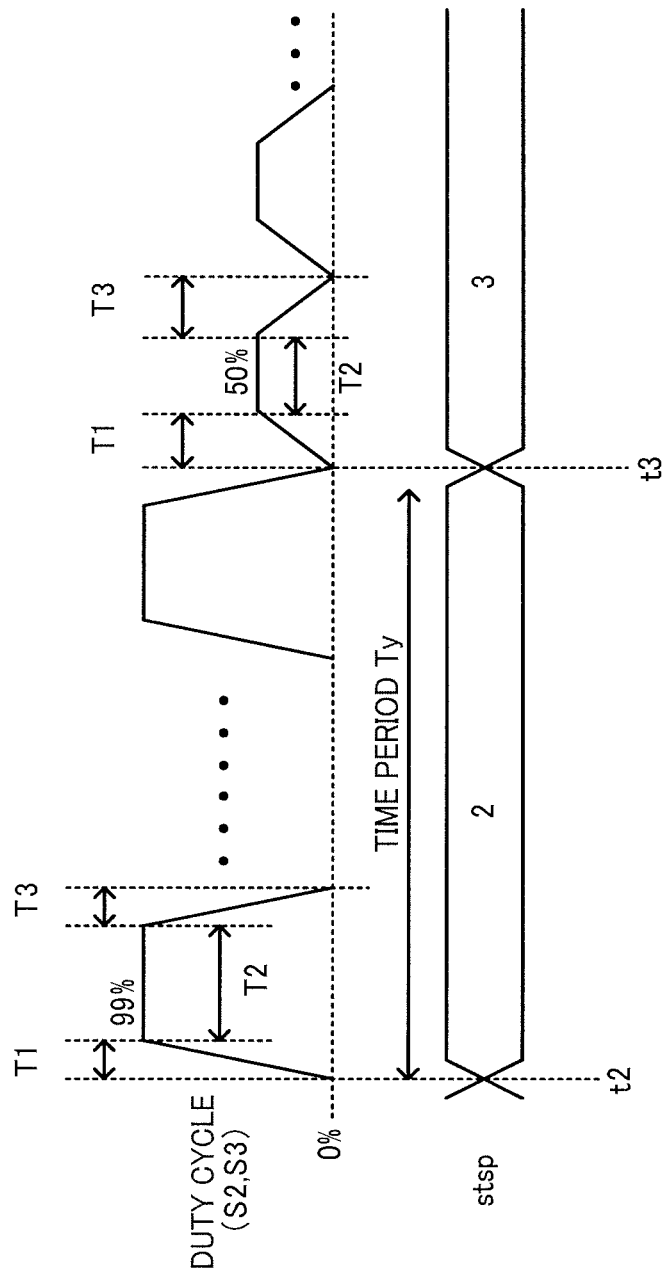
FIG. 13 is a diagram illustrating one example of a waveform when changing a ratio of a time period T2.

Here, the ratio among the time periods T1 to T3 is set to be constant in the time period from time t2 to time t3 and in the time period after time t3, however, it is not limited thereto. For example, as depicted in FIG. 13, the proportion of the time period T2 to the time periods T1 to t3 may be increased in the time period Ty. Specifically, a configuration may be such that while the signal stsp2 is outputted, the mode signal output circuit 52 increases the proportion of the time period T2 to the time period TA and that when the signal stsp3 is outputted, the mode signal output circuit 52 decreases the proportion of the time period T2 to the time period TA. As such, with the increased proportion of the time period T2 in the time period Ty, the motor 11 can be rotated more smoothly. In order to realize FIG. 13, the start value calculating circuit 110 of the mode signal output circuit 52 may be caused to calculate different start values based on signals stsp2 and stsp3, for example.

==Regarding Duty cycle Changing Circuit 46b (Second Embodiment)==

Figure 14:
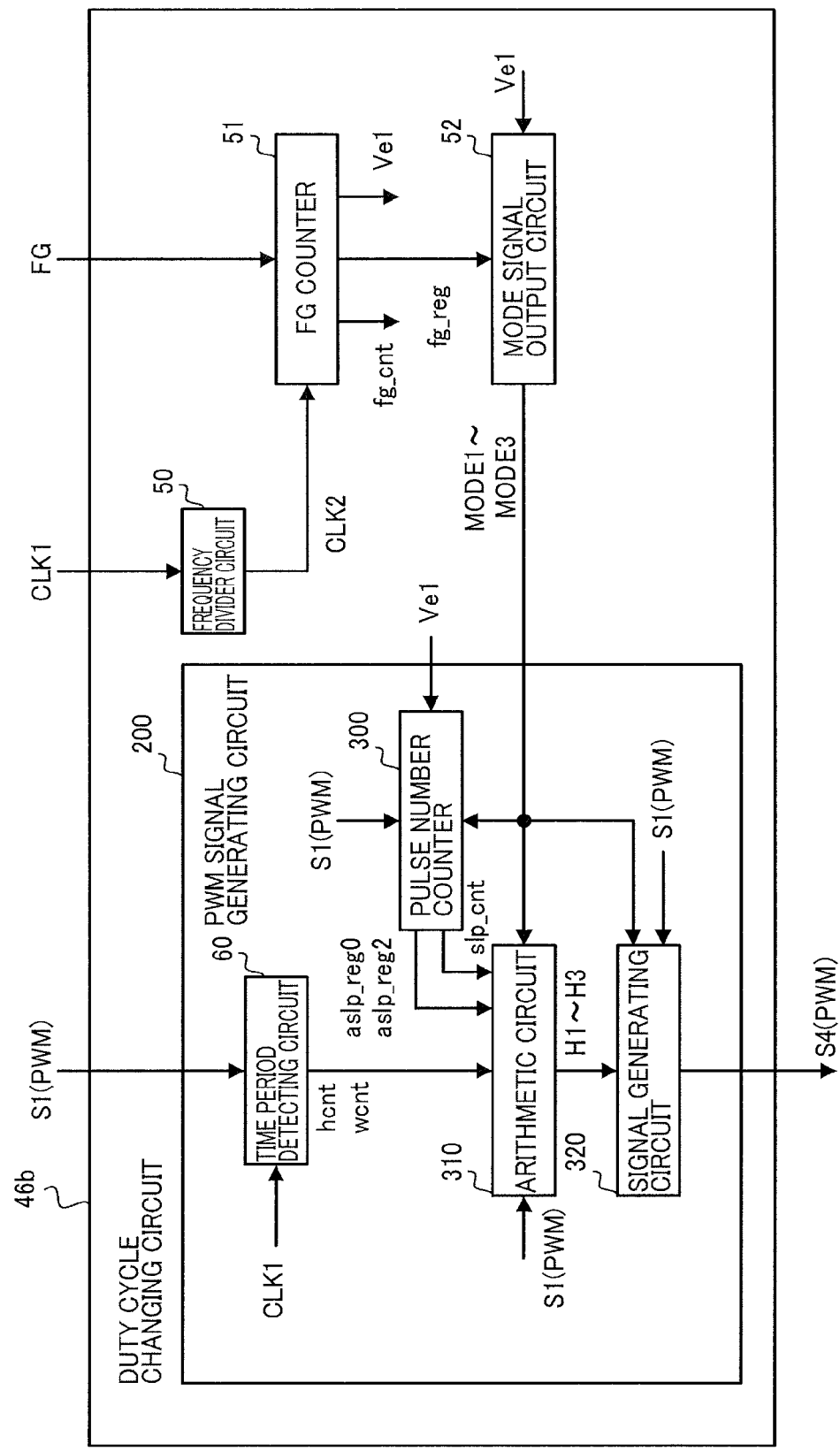
FIG. 14 is a diagram illustrating a configuration of a duty cycle changing circuit 46b.

FIG. 14 depicts a configuration of a second embodiment of the duty cycle changing circuit 46. In FIG. 3 and FIG. 14, equivalent blocks are designated by the same reference numerals.

In a duty cycle changing circuit 46b of FIG. 14, a PWM signal generating circuit 200 is used in place of the PWM signal generating circuit 53.

The PWM signal generating circuit 200 is a circuit configured to generate a PWM signal S4 in synchronization with the inputted PWM signal S1, and includes the time period detecting circuit 60, a pulse number counter 300, an arithmetic circuit 310, and a signal generating circuit 320. Since the time period detecting circuit 60 is a block similar to that depicted in FIG. 3, description thereof is omitted.

The pulse number counter 300 counts the number of pulses of the inputted PWM signal S1 in each of the time periods T1 and T3. Then the pulse number counter 300 outputs the number of pulses of the PWM signal S1 obtained by counting in the time period T1 as "aslp_reg0", and outputs the number of pulses of the PWM signal S1 obtained by counting in the time period T3 as "aslp_reg2", to the arithmetic circuit 310. It should be noted that "aslp_reg0" is the amount of change in a count value slp_cnt of the pulse number counter 300 in the time period T1, and "aslp_reg2" is the amount of change in a count value slp_cnt of the pulse number counter 300 in the time period T3.

The pulse number counter 300 is reset when the edge pulse Ve1 is inputted thereto and is set at "1" as the count value slp_cnt when the mode signal MODE3 is inputted thereto, for example.

The arithmetic circuit 310 is configured to calculate, in synchronization with the PWM signal S1, high-level periods H1 to H3 in one period of the PWM signal S4 in each of the periods T1 to T3.

Specifically, the arithmetic circuit 310 calculates the High-level period H1 in the time period T1, based on a following equation (7), every time the count value slp_cnt changes.

$$H1=(\text{hcnt}/\text{aslp\_reg0})\times \text{slp\_cnt} \quad (7)$$

As is apparent from the equation (7), as the time period T1 starts and the count value slp_cnt is incremented, the high-level period H1 increases. In the equation (7), "aslp_reg0" is the amount of change in the count value slp_cnt during a time period until when the time period T1 ends. Thus, when the time period T1 ends, the high-level period H1 results in H1=hcnt.

Further, the arithmetic circuit 310 calculates the high-level period H2 in the time period T2, based on an equation (8).

$$H2=\text{Hcnt} \quad (8)$$

Furthermore, the arithmetic circuit 310 calculates the high-level period H3 in the time period T3, based on an equation (9), every time the count value slp_cnt changes.

$$H3=\text{hcnt}-(\text{hcnt}/\text{aslp\_reg2})\times(\text{slp\_cnt}) \quad (9)$$

Thus, when the count value slp_cnt is incremented, the high-level period H3 is lowered. Further, in the equation (9), "aslp_reg2" is the amount of change in the count value slp_cnt during a time period until when the time period T3 ends. Thus, when the count value slp_cnt becomes equal to aslp_reg2 that is a value when the time period T3 ends, the high-level period H3 results in H3=0.

However, similarly to the circuit in FIG. 3, the mode signal MODE3 might continue to be outputted and the count value slp_cnt might continue to be incremented. In such a case, since the count value slp_cnt continues to be incremented, the high-level period H3 results in a negative value. Thus, for example, when a result of the calculation of the high-level period H3 results in a negative value, the arithmetic circuit 310 outputs "0" as the high-level period H3.

That is, if the value obtained by the equation (9) results in a negative value, H3 is given by $$H3=0 \quad (10).$$

When executing the calculations of the equations (7) and (9), the arithmetic circuit 310 calculates the product of the value hcnt indicative of the high-level period and the count value slp_cnt before division processing, in order to improve calculation accuracy.

The signal generating circuit 320 is configured to generate, in synchronization with the PWM signal S1, the PWM signal S4 with the high-level periods H1 to H3 calculated in the respective time periods T1 to T3.

Here, a description will be given of one example of the waveform of the PWM signal S4 generated in the signal generating circuit 320 with reference to FIG. 15. It is assumed here that the number of pulses "aslp_reg0" of the PWM signal S1 in the time period T1 is "4", and the number of pulses "aslp_reg2" of the PWM signal S1 in the time period T3 is "8". It is also assumed that the count value "hcnt" indicative of the high-level period of the PWM signal S1 is "80" and the count value "wcnt" indicative of the time period of one period of the PWM signal S1 is "160". That is, the duty cycle of the PWM signal S1 is 50%.

It is further assumed here that the time period during which the FG signal is actually high is equal to the time period TA.

Firstly, by assigning values to variables in the equation (7), the high-level period H1 in the time period T1 is expressed by an equation (11).

$$H1=(80/4)\times slp\_cnt \quad (11)$$

Thus, until the count value slp_cnt changes from "0" to "4", the high-level period H1 increases in a stepwise manner. The High-level period H2 in the time period T2 is maintained constant at "80" as is apparent from the equation (8).

Then, when the time period T3 starts, by assigning values to variables in the equation (9), the high-level period H3 in the time period T3 is expressed by an equation (12).

$$H3=80-((80/8)\times slp\_cnt) \quad (12)$$

Thus, until the count value slp_cnt changes from "1" to "8", the high-level period H3 decreases in a stepwise manner. Since the PWM signal S4 and the PWM signal S1 are of the same period, if the high-level period of H1 to H3 changes, the duty cycle of the PWM signal S4 changes in the same manner. As a result, the duty cycle of the PWM signal S4 increases in a gradual manner, is maintained constant (50%), and thereafter decreases in a gradual manner.

As such, also in the case of using the duty cycle changing circuit 46b depicted in FIG. 14, the drive current Idr changes in the same manner as in the case of using the duty cycle changing circuit 46a depicted in FIG. 3. Thus, the waveform similar to that of FIG. 9 can be obtained also in the case of using the duty cycle changing circuit 46b.

Figure 12:
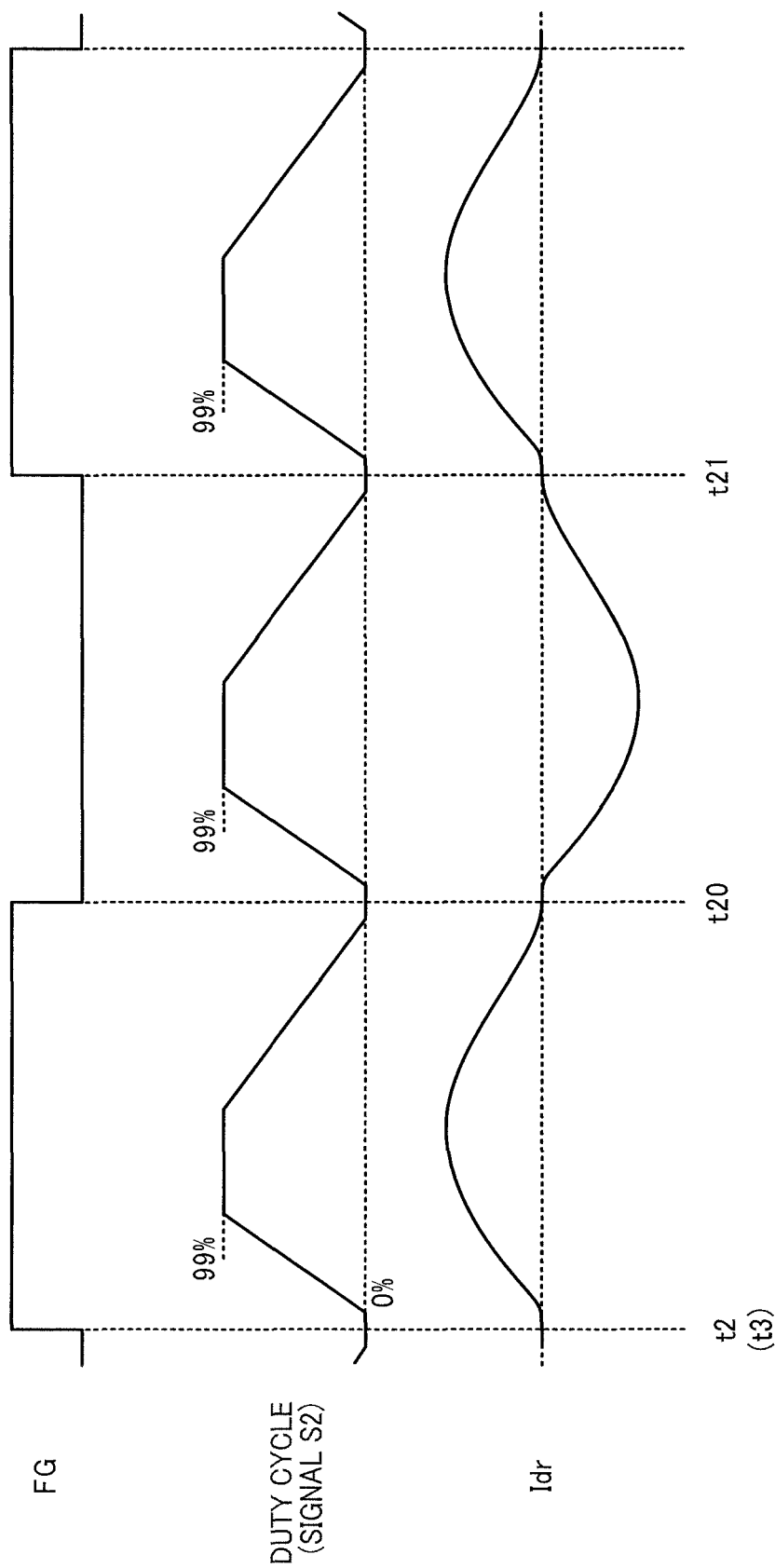
FIG. 12 is a diagram of major waveforms of a motor drive IC 10 in a time period Ty.

Hereinabove, a description has been given of the motor drive IC 10 according to an embodiment of the present invention. For example, as depicted in FIGS. 10 and 12, in the time period Ty in which the motor is started, the drive current Idr flowing at the time of the phase switching is small. Thus, it becomes possible to silently rotate the motor 11 while suppressing the abrupt change in the drive current Idr flowing through the motor 11. Further, in an embodiment of the present invention, since the drive current Idr is small at the time of the phase switching, the torque efficiency can be improved.

The time period Tx and the time period Ty may be set at a predetermined period (e.g., Tx, Ty=10 ms), for example. In such a case, however, it is possible that the number of rotations does not increase sufficiently and the rotation cannot be started smoothly, depending on the type, etc., of the motor 11. In an embodiment of the present invention, the time period Tx and the time period Ty are determined based on the FG signal. Thus, in an embodiment of the present invention, the rotation speed of the motor 11 can smoothly be changed up to a desired rotation speed.

The duty cycle changing circuit 46a generates the PWM signal S2 whose duty cycle reaches 0% when the logic level of the FG signal changes. Thus, since the drive current Idr can be caused to reach zero with the timing of the phase switching, the abrupt change in the drive current Idr flowing through the motor 11 can be securely suppressed.

In the time period Tx, the H-bridge circuit 22 is driven based on the PWM signal S3 with the duty cycle of 100%. Thus, in an embodiment of the present invention, the motor 11 can be reliably changed from the stopped state to the rotating state.

While it is assumed that the motor 11 is a fan motor, the motor 11 may be a vibration motor, for example. Even if the motor 11 is the vibration motor, change in the drive current Idr can be suppressed at the time of the phase switching, thereby being able to reduce noise.

It is assumed that, in the time period Tx, the H-bridge circuit 22 is driven based on the PWM signal S3 with the duty cycle of 100%, for example, but it is not limited thereto. In the time period Tx, the H-bridge circuit 22 is only required to be driven at the duty cycle (e.g., 50%) capable of starting to rotate the motor 11.

Further, in the time period Ty, the duty cycle of the PWM signal S2 is increased up to 99%, but it is not limited thereto. For example, in the time period Ty, the duty cycle of the PWM signal S2 may be increased up to 50%, for example. In this case, however, a separate circuit (not shown) to generate the PWM signal with the duty cycle of 50% is required to be provided in the drive signal output circuit 21. Further, in this case, it is required to cause the selector 45 to output the PWM signal with the duty cycle of 50% as the PWM signal S1, when the signal stsp2 is inputted, for example. Even in such a case, an effect similar to that in an embodiment of the present invention can be obtained.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. A PWM signal output circuit configured to output a PWM signal with a duty cycle corresponding to a duty cycle of an input signal to a drive circuit configured to drive a motor based on the PWM signal, the PWM signal output circuit comprising:
    a speed signal generating unit configured to generate a speed signal having a period corresponding to a rotation speed of the motor and having a logic level changing in an alternate manner;
    a first output unit configured to output the PWM signal with a first duty cycle, in during a first time period in which the motor starts to rotate;

a second output unit configured to output when the speed signal changes in logic level during a second time period following the first time period, the PWM signal whose duty cycle increases toward a second duty cycle and thereafter decreases from the second duty cycle so as to cause a current flowing through a motor coil of the motor to increase and thereafter decrease within a time period from the change in logic level of the speed signal until a subsequent change in logic level of the speed signal; and a third output unit configured to output, when the speed signal changes in logic level after the second time period has elapsed, the PWM signal whose duty cycle increases toward the duty cycle of the input signal and thereafter decreases from the duty cycle of the input signal so as to cause the current flowing through the motor coil to increase and thereafter decrease within a time period from the change in logic level of the speed signal until a subsequent change in logic level of the speed signal.

2. The PWM signal output circuit of claim 1, further comprising:

a counter configured to update a count value based on the speed signal after the motor starts to rotate, wherein the first output unit is configured to output the PWM signal with the first duty cycle until the count value reaches a first count value indicating that the first time period ends, wherein the second output unit is configured to output, when the speed signal changes in logic level during a time period from when the count value reaches the first count value until when the count value reaches a second count value indicating that the second time period ends, the PWM signal whose duty cycle increases toward the second duty cycle and thereafter decreases from the second duty cycle within a time period from the change in logic level of the speed signal until a subsequent change in logic level of the speed signal, and wherein the third output unit is configured to output, when the speed signal changes in logic level and the count value reaches the second count value, the PWM signal whose duty cycle increases toward the duty cycle of the input signal and thereafter decreases from the duty cycle of the input signal within a time period from the change in logic level of the speed signal until a subsequent change in logic level of the speed signal.

3. The PWM signal output circuit of claim 1, wherein the second output unit is configured to output, when the speed signal changes in logic level, the PWM signal whose duty cycle increases from 0% toward the second duty cycle and thereafter decreases from the second duty cycle within a time period from the change in logic level of the speed signal until a subsequent change in logic level of the speed signal, and wherein the third output unit is configured to output, when the speed signal changes in logic level, the PWM signal whose duty cycle increases from 0% toward the duty cycle of the input signal and thereafter decreases from the duty cycle of the input signal within a time period from the change in logic level of the speed signal until a subsequent change in logic level of the speed signal.

4. The PWM signal output circuit of claim 1, wherein the first duty cycle is 100%.

* * * * *